(12) United States Patent
Park et al.

(10) Patent No.: US 11,085,968 B2
(45) Date of Patent: Aug. 10, 2021

(54) METHOD AND APPARATUS FOR ESTIMATING LIFESPAN OF BATTERY

(71) Applicant: HYOSUNG HEAVY INDUSTRIES CORPORATION, Seoul (KR)

(72) Inventors: Sang Hui Park, Anyang-si (KR); Hwa Seob Song, Seoul (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 140 days.

(21) Appl. No.: 16/467,085

(22) PCT Filed: Dec. 6, 2017

(86) PCT No.: PCT/KR2017/014231
§ 371 (c)(1),
(2) Date: Jun. 6, 2019

(87) PCT Pub. No.: WO2018/106015
PCT Pub. Date: Jun. 14, 2018

(65) Prior Publication Data
US 2019/0317150 A1 Oct. 17, 2019

Related U.S. Application Data

(63) Continuation of application No. PCT/KR2017/014231, filed on Dec. 6, 2017.

(30) Foreign Application Priority Data

Dec. 9, 2016 (KR) .................. 10-2016-0167982

(51) Int. Cl.
*G01R 31/382* (2019.01)
*G01R 31/392* (2019.01)
*H01M 10/48* (2006.01)

(52) U.S. Cl.
CPC ......... *G01R 31/382* (2019.01); *G01R 31/392* (2019.01); *H01M 10/48* (2013.01)

(58) Field of Classification Search
None
See application file for complete search history.

(56) References Cited

U.S. PATENT DOCUMENTS 7,576,545 B2 * 8/2009 Singh .................... H01M 10/48
324/427
2005/0017725 A1 1/2005 Murakami et al.
(Continued)

FOREIGN PATENT DOCUMENTS

JP 04-331427 A 11/1992
JP 2001-292534 A 10/2001
(Continued)

OTHER PUBLICATIONS

Li et al. ("A Similarity-Based Prognostics Approach for Full Cells State of Health" 2014, Prognostics and System Health Management Conference (PHM-2014 Hunan), Zhangiiaijie, 2014, pp. 279-283, doi: 10.1109/PHM.2014.6988179. (Year: 2014).*
(Continued)

*Primary Examiner* — Roy Y Yi
(74) *Attorney, Agent, or Firm* — Novick, Kim & Lee, PLLC; Jae Youn Kim (57) ABSTRACT

A method for estimating lifespan of a battery in accordance with the present invention, comprising steps of: fully discharging the battery; partially charging the fully discharged battery under a predetermined charging condition; acquiring pieces of voltage information at multiple specific points of measurement time while partially charging the battery; and calculating remaining capacity of the battery by using the acquired pieces of voltage information. An apparatus for estimating lifespan of a battery in accordance with the present invention, comprising: a reference data-storing unit for storing reference data that become a basis of estimating the lifespan of the battery; a charge/discharge-controlling unit for fully discharging the battery to estimate the lifespan
(Continued)

of and partially charging the battery under a predetermined charging condition; a voltage information-acquiring unit for acquiring pieces of voltage information of the battery at multiple specific points of measurement time while partially discharging the battery; and a remaining capacity-calculating unit for calculating remaining capacity of the battery by using the acquired voltage information and the reference data.

6 Claims, 10 Drawing Sheets

(56) References Cited

U.S. PATENT DOCUMENTS

| | | |
|---|---|---|
| 2008/0094031 A1 | 4/2008 | Singh et al. |
| 2015/0349385 A1 | 12/2015 | Hu et al. |
| 2016/0209472 A1 | 7/2016 | Chow et al. |

FOREIGN PATENT DOCUMENTS

| | | |
|---|---|---|
| JP | 2007-078506 A | 3/2007 |
| KR | 10-2010-0019660 A | 2/2010 |
| KR | 10-2013-0125141 A | 11/2013 |
| KR | 10-2014-0106142 A | 9/2014 |

OTHER PUBLICATIONS

Tian ("Artificial Fish Swarm Algorithm-Based Particle Filter for Li-Ion Battery Life Prediction" 2014, Mathematical Problems in Engineering, Hindawi Publishing Corporation) (Year: 2014).*

* cited by examiner

METHOD AND APPARATUS FOR ESTIMATING LIFESPAN OF BATTERY

FIELD OF THE INVENTION

The present invention relates to a method and an apparatus for estimating lifespan of a battery; and more particularly to the method and the apparatus for accurately estimating residual lifespan of the battery in its actual use by applying a statistical technique.

BACKGROUND OF THE INVENTION

There have been largely increasing domestic and foreign studies related to secondary batteries ("rechargeable batteries" or "batteries") engaged in electric vehicles. In general, the studies related to the rechargeable batteries have focused on improvement of performance including sharply increased capacities, lighter weight, and quicker charging of rechargeable batteries.

As importance of prediction of breakdown of the rechargeable batteries has been recognized due to accidents caused by unexpected breakdown of rechargeable batteries such as the breakdown of the battery of NASA's Mars probe, studies on a new field, which is called Prognostics and Health Management (PHM), are vigorously pushed forward.

The capacities of the rechargeable batteries are gradually reduced with repeated charge/discharge operation and when the capacities drop to 80% of their original capacities, the batteries are considered to go out of service. Generally, factors for identifying state of the rechargeable battery may divide state of charge (SOC), state of health (SOH), and state of life (SOL). Among them, the SOC has been studied relatively for a long time, but studies on the SOH for evaluating soundness and the SOL for predicting breakdown of a battery have been recently actively performed.

Among them, the SOH is to measure battery capacity that has been decreased so far. To accurately measure it, full charge and discharge tests which repeat cycles of full charge/discharge must be conducted. However, as it was impossible to measure the capacity during use, it could not be applied in estimating the lifespan in real time.

In addition, even in case of a battery apparatus composed of the same type or same combination of battery cells, due to different environments where batteries are used, or deviations of individual battery cells, all of their lifespans upon their use were different and there was no proper solution for accurately calculating the residual lifespan of the batteries.

DETAILED EXPLANATION OF THE INVENTION

Technical Problem

The present invention intends to provide a method and an apparatus for estimating lifespan of a battery in actual use more accurately.

More specifically, the present invention, as a method for measuring remaining capacity at current state of charge from operation data of a system at a site of an ESS and estimating residual lifespan available in future, intends to provide a method and an apparatus for estimating the residual lifespan by measuring an increment of voltage after a given time when charging a battery which has been fully discharged (at SOC of 0%) under a predetermined charging condition upon an operation of the ESS, calculating capacity at the current time, and applying particle filter as a statistical technique based thereon.

Means of Solving the Problem

A method for estimating lifespan of a battery, comprising steps of: fully discharging the battery; partially charging the fully discharged battery under a predetermined charging condition; acquiring pieces of voltage information at multiple specific points of measurement time while partially charging the battery; and calculating remaining capacity of the battery by using the acquired pieces of voltage information.

Herein, at the step of acquiring pieces of voltage information, increments of voltage from a time of starting to charge the fully discharged battery to the specific points of measurement time may be acquired.

Herein, at the step of calculating remaining capacity of the battery, particle filter may be applied to the acquired pieces of voltage information.

Herein, the step of fully discharging may be performed when load starts to be stabilized based on operation schedule or accumulated operation pattern of an ESS composed of the battery.

Herein, the step of fully discharging may be performed if SOC of the battery is lower than a preset threshold when the load starts to be stabilized.

Herein, the step of calculating the remaining capacity of the battery may include steps of: calculating battery capacity measured at one cycle of full discharge and charge once by using the measured increments of voltage; and calculating the residual lifespan of the battery by applying capacities measured at multiple cycles of full discharge and charge to a statistical method.

An apparatus for estimating lifespan of a battery, comprising: a reference data-storing unit for storing reference data that become a basis of estimating the lifespan of the battery; a charge/discharge-controlling unit for fully discharging the battery subject to the estimation of the lifespan and partially charging the battery under a predetermined charging condition; a voltage information-acquiring unit for acquiring pieces of voltage information of the battery at multiple specific points of measurement time while partially discharging the battery; and a remaining capacity-calculating unit for calculating remaining capacity of the battery by using the acquired pieces of voltage information and the reference data.

Herein, during actual use of the battery, full discharge is performed when load starts to be stabilized based on operation schedule or accumulated operation pattern of an ESS composed of the battery.

Herein, a unit for creating reference data to acquire the pieces of voltage information of the battery at the multiple specific points of measurement time if charge/discharge operations are conducted in a scope that meets the predetermined charging condition after the full discharge, and creating the reference data stored in the reference data-storing unit may be further comprised.

Herein, the remaining capacity-calculating unit may repeat a step of calculating battery capacity measured at one cycle of full discharge and charge, and also at multiple cycles of full discharge and charge and then calculate the residual lifespan of the battery by the calculated battery capacities which are applied to particle filter.

Effects of the Invention

The implementation of a method or an apparatus for estimating lifespan of a battery in accordance with the aforementioned configuration may lead residual lifespan of the battery in use in an ESS to be estimated more accurately.

From the aspects of an enterpriser and an ESS operator, the method or the apparatus for estimating lifespan of a battery in the present invention may confirm a period of maintenance and use based on the accurate residual lifespan of a built ESS.

From the aspect of an ESS manufacturer, the method or the apparatus for estimating lifespan of a battery in the present invention may predict whole lifespan and residual lifespan of a manufactured product and emphasize product reliability and predominance of technology.

DETAILED DESCRIPTION OF THE PREFERRED EMBODIMENTS

Detailed example embodiments to implement the present invention will be explained below by referring to attached drawings.

Upon explanation of the present invention, terms such as "a first," "a second," etc. may be used to explain a variety of components but the components may not be limited by such terms. The terms are used only for the purpose of distinguishing one component from another. For example, a first component may be named as a second component without being beyond the scope of the right of the present invention and similarly, even a second component may be named as a first one.

If it is mentioned that a component is connected or linked to another component, it may be understood that the component may be directly connected or linked to the another component but also a third component may exist in between them.

The terms used in this specification are used only to explain specific example embodiments and they are not intended to limit the present invention. Unless a context clearly indicates a different meaning, any reference to singular may include plural ones.

In this specification, it may be understood: that terms such as "include," or "equip" are intended to designate that features, numbers, steps, movements, components, parts, or their combinations exist; and that existence or addibility of one or more other features, numbers, steps, movements, components, parts, or their combinations are not excluded in advance.

For example, a battery used in an ESS may have a plurality of battery racks, each of which has a plurality of battery modules, but for convenience of explanation, it will be assumed that it has multiple battery modules (or cells).

For example, now, the classifications and standards for state of health (SOH), and state of life (SOL) of a battery are not clear in the industry but SOH will be explained as one example of the life of a battery.

For clearer explanation, shapes, sizes, etc. of elements in drawings, moreover, may be exaggerated clearer explanation.

A method for estimating lifespan of a battery in accordance with the idea of the present invention may estimate state by using increments of voltage of actual operating data of an ESS with a battery. It may use difference between voltages after a given time upon charging at state of full discharge and both partial and full charge/discharge data. Besides, it proposes a variety of statistical relationships to estimate residual lifespan, and particularly, proposes the use of particle filter as an optimal solution.

Figure 1:
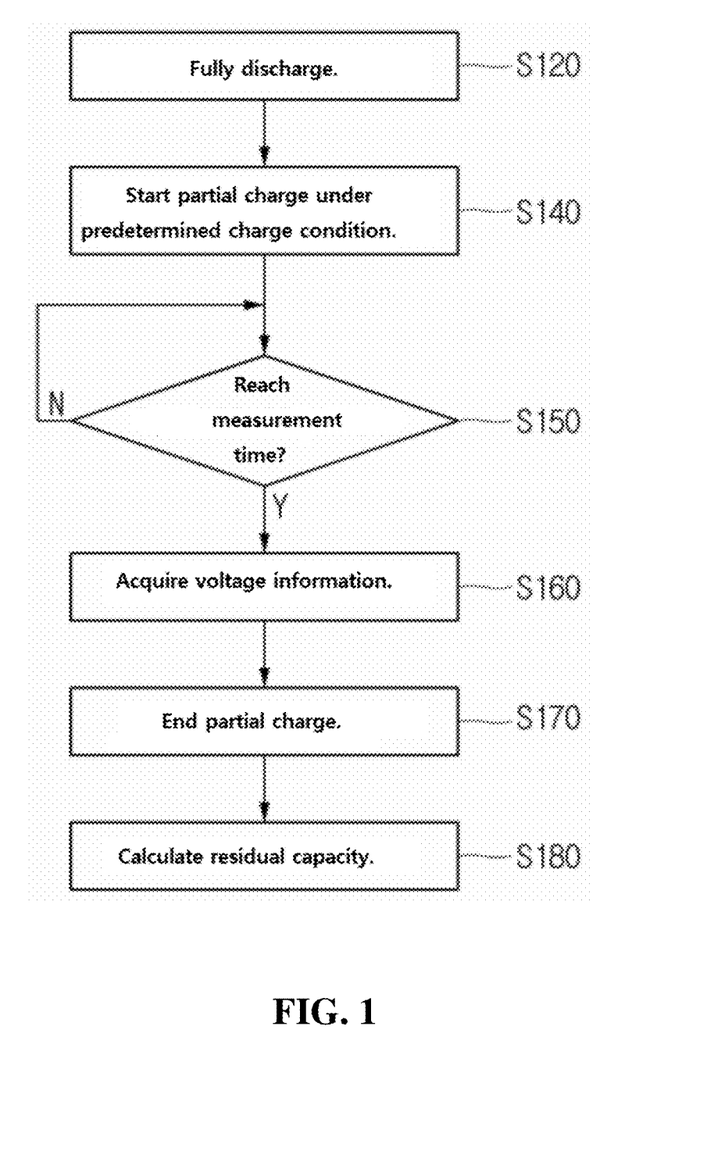
FIG. 1 is a flowchart illustrating a method for estimating lifespan of a battery in accordance with one example embodiment of the present invention.

FIG. 1 illustrates a method for estimating lifespan of a battery in accordance with one example embodiment of the present invention.

The illustrated method for estimating the lifespan of the battery may comprise steps of: fully discharging the battery under a predetermined discharging condition as S120; partially charging the fully discharged battery under a predetermined charging condition as S140; acquiring pieces of voltage information at multiple specific points of measurement time while partially charging the battery as S160; and calculating remaining capacity of the battery by using the acquired pieces of voltage information as S180.

For example, the method for estimating capacity (SOH) of the battery illustrated in FIG. 1 is to measure increments of voltage of a lithium-ion battery in use with a random current or power profile at S160 while charging it at a certain C-rate (a charging condition) for a given time at S140 and S170 after fully discharging it at S120 and then to estimate its scope of capacity (SOH) by applying the measured increments of voltage to particle filter, a kind of statistical and analytic technique in serial order at S180.

In accordance with the implementation, the certain C-rate (the charging condition) may be applied even after the full discharge at S120. Even in this case, the C-rate which is a fully discharging condition at the step of fully discharging the battery as S120 and the C-rate which is a charging condition at the steps of charging the battery as S140 and S170 may be symmetrically identical to each other or have different conditions.

In the drawing, as the fully discharging condition and the charging condition, the 1 C discharging condition for a given time and the 1 C charging condition for a given time were applied.

In accordance with the implementation, the C-rate may use a fully discharging or full charging condition for an hour or use a condition similar to an environment or site where the battery is actually used.

In accordance with the example embodiment, the method for estimating the lifespan of the battery may be performed with one, two, or multiple cycles of full discharge and charge. One cycle of full discharge and charge may have at least two points of time of measuring voltage information. In other words, at one cycle of full discharge and charge, there may be at least two points of measurement time when S150 is performed. The advantage of the case that two points of time of measuring voltage information exist at one cycle of full discharge and charge will be explained later.

The method for estimating the lifespan of the battery in accordance with the example embodiment may be performed once or multiple times regularly or irregularly during operation, or multiple times consecutively at a preset point of time of measuring remaining capacity of the battery. In the latter case, after the steps of fully discharging the battery as S120 and acquiring the pieces of the voltage information as S160 are repeated at least twice, the step of calculating the remaining capacity as S180 is performed.

In accordance with the implementation, at one cycle of full discharge and charge to estimate the residual lifespan of the battery, a cycle of full discharge and full charge or a cycle of full discharge and partial charge may be conducted. The latter case is useful because it may shorten the measurement time in an actual operating environment.

When one cycle of full charge and discharge is closed at S170, the remaining capacity of the battery is calculated at S180 by using the acquired pieces of voltage information at $160 at the multiple points of the measurement time during one cycle of full charge and discharge.

During one cycle of full charge and discharge, pieces of voltage information may be measured multiple times. When the charging condition (C-rate) is changed at S140 due to the work of measuring a piece of voltage information at a specific point of measurement time, a piece of the voltage information measured at the next point of measurement time becomes less reliable. Accordingly, at the step of acquiring the pieces of the voltage information, it is advantageous to perform a method of measuring voltage that does not affect the charging condition. For example, the voltage may be measured by using a MOSFET which has good gate insulating properties or a current transformer with relatively less turns.

If the method of measuring voltage affects the charging condition to some degree, the charging condition would not be affected at an initial point of measurement time during one cycle of full charge and discharge and therefore, it can be seen that the increasement of the voltage is highly reliable. Meanwhile, the information on the increment of the fully discharged voltage has the largest value at the last point of measurement time during one cycle of full charge and discharge, and the ratio of noise to the large value is low. It can be seen that even the increment of voltage at the last point of measurement time is highly reliable.

In consideration of this, at the step S180 of calculating the remaining capacity, the increment of voltage at the initial point of measurement time and/or that at the last point of measurement may give higher reliability than those at the other points of measurement time.

At the step S160 of acquiring the pieces of the voltage information, the increments of voltage are measured and acquired from the point of measurement time of the fully discharged battery to the point of measurement time at S150.

At the step S180 of calculating the remaining capacity of the battery, a statistical technique to the pieces of information on increments of voltage acquired at S160 may be applied and the residual lifespan of the battery may be calculated in a method of comparing them with already stored reference data. As the statistical technique, particle filter may be applied to the acquired pieces of voltage information.

The step S180 of calculating the remaining capacity of the battery may include steps of calculating capacity (SOH) of a battery at one cycle of full charge and discharge during which the measurement is made from the measured increments of voltage at S160; and calculating residual lifespan of the battery (i.e., a cycle of discharge and charge to a preset threshold (e.g., 80% of the capacity) by applying the capacity (SOH) of the battery calculated at multiple cycles of full discharge and charge.

Figure 2:
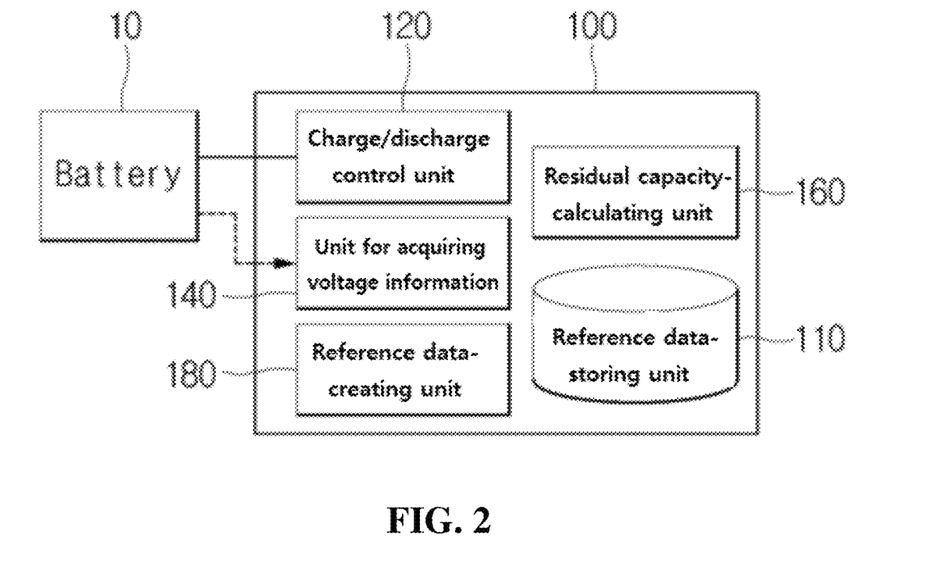
FIG. 2 is a block diagram illustrating an apparatus for estimating lifespan of a battery that may use the method of estimating the lifespan of the battery in FIG. 1 in accordance with another example embodiment of the present invention.

FIG. 2 illustrates an apparatus for estimating lifespan of a battery that may use the method of estimating the lifespan of the battery in FIG. 1 in accordance with another example embodiment of the present invention.

The apparatus for estimating the lifespan of the battery illustrated may comprise: a reference data-storing unit 110 for storing reference data that become a basis of estimating the lifespan of the battery 10; a charge/discharge-controlling unit 120 for fully discharging the battery 10 to estimate the lifespan of and partially charging the battery under a predetermined charging condition; a voltage information-acquiring unit 140 for acquiring pieces of voltage information of the battery 10 at multiple specific points of measurement time while partially discharging the battery; and a remaining capacity-calculating unit 160 for calculating remaining capacity of the battery 10 by using the acquired voltage information and the reference data.

In accordance with the implementation, the reference data may be updated by using not only pieces of information stored in the reference data-storing unit 110 by the manufacturer just after the manufacture of the battery but also accumulated measured data of the battery during actual use.

In this case, the apparatus for estimating the lifespan of the battery may further comprise a unit 180 for creating reference data to acquire the pieces of the voltage information of the battery 10 at specific points of measurement time and storing them in the reference data-storing unit if operation of discharge and charge is conducted within the scope of meeting the fully discharging condition and the charging condition during the actual use of the battery 10.

In the reference data-storing unit 110, reference data required to apply particle filter may be stored. For example, the reference data may include data tested to estimate the lifespan by the manufacturer after the manufacture of the battery has been completed. For example, the reference data may include measured data during actual use of an already manufactured battery with the same specification as the battery, which is used at a real site. For instance, data in the graphs in FIGS. 5 and 7 to be shown below may be recorded in the reference data-storing unit 110.

The charge/discharge-controlling unit 120 may have a common discharge/charge circuit of the battery 10 and further have a discharge/charge circuit for performing charge and discharge under certain full discharge and charging conditions to calculate the residual lifespan of the battery in accordance with the idea of the present invention.

The voltage information-acquiring unit 140 may measure non-load voltage or load voltage of the battery 10, but the latter is more appropriate. The voltage information-acquiring unit 140 may have a voltage sensor to measure voltage of an output port of the battery 10. It is advantageous that the voltage information-acquiring unit 140 performs a method of measuring voltage that does not affect any charging condition during the course of measuring the residual lifespan of the battery. For instance, it may equip a sensor measuring voltage by using excellent MOSFET with good gate insulating properties or a current transformer with relatively less turns.

The remaining capacity-calculating unit 160 may calculate the residual lifespan of the battery by applying a statistical technique for pieces of information on the increments of voltage acquired by the voltage information-acquiring unit 140 and using a method of comparing the already stored reference data with the reference data-storing unit 110. As the statistical technique, the particle filter may be applied for the acquired pieces of voltage information.

Figure 3A:
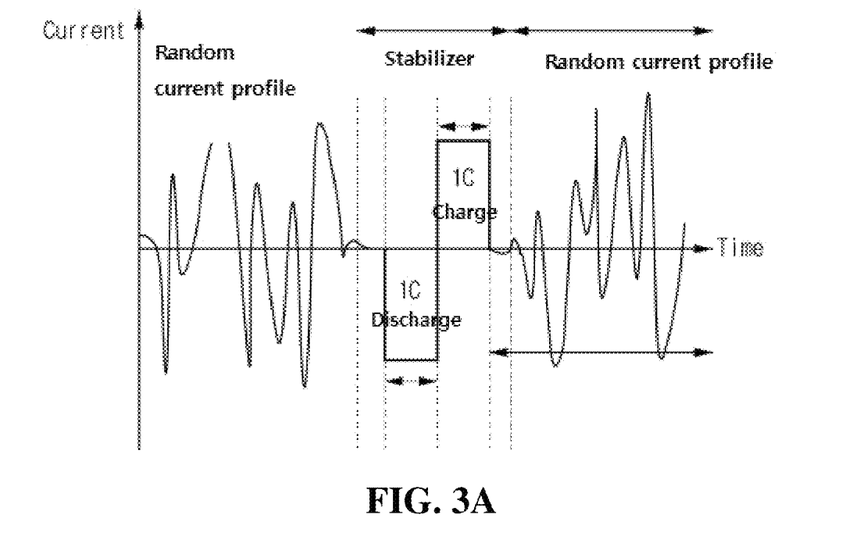
FIGS. 3A and 3B are graphs that measure increments of voltage while charging a battery under a predetermined charging condition for a given time after fully discharging under a fully discharging condition to estimate current capacity of the battery.
Figure 3B:
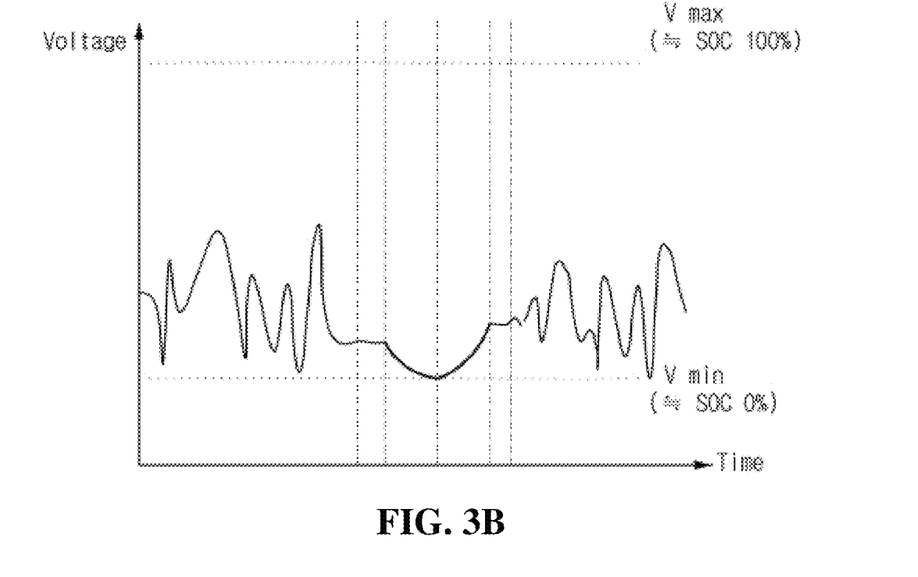

FIGS. 3A and 3B are to explain a course of measuring increments of voltage of a lithium-ion battery in use with a random current or power profile while charging it at a certain C-rate (a charging condition) for a given time after fully discharging it to estimate its current capacity (SOH).

FIG. 3A illustrates a current pattern from a stabilizer upon charges during actual use after full discharge in accordance with the idea of the present invention and FIG. 3B illustrates a voltage pattern under the same situation.

FIGS. 3A and 3B illustrate output current and voltage of a battery during a course of charging the battery in actual use under an 1C profile (i.e., a predetermined charging condition) illustrated for a given time after fully discharging it under the 1 C profile for measurement to estimate the lifespan of the battery as the random current or power profile in the lithium-ion battery over time.

The illustrated profile is created during a course of estimating the SOH by using the gradient of the charge voltage after full discharge at SOC of 0%. Because the estimation of the capacity illustrated in a section when load becomes stabilized during the actual use is performed, the illustrated current and pattern may be at the state of the load being connected in the actual use. It is more effective to perform at the section when the SOC is low at the moment of the load starting to be stabilized during use of the ESS.

FIG. 4 illustrates a course of deducing relationships between increments of voltage $\Delta V$ and SOH as residual lifespan when the charge is performed for the given time after full discharge (for 10 minutes in the drawing).

Figure 4A:
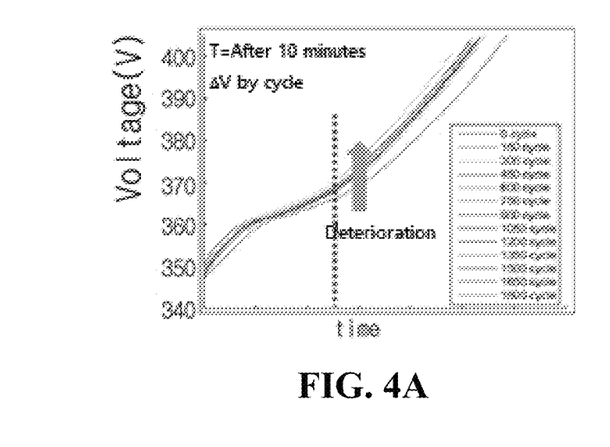
FIG. 4A is a graph representing change in voltage by time when performing charge of a battery after full discharge at every cycle of charge and discharge of the battery.

FIG. 4A represents change in voltage over time when charging is performed after full discharge every cycle of discharge and discharge of the battery. Among cross axes of time and voltage in the drawing, the cross axis of time starts from 2 minutes and the drawing shows a pattern of increasing voltage over time after charge starts. It can be found out that as cycles of discharge and charge of the battery increase, the increments of voltage increase during the same time period. In the drawing, the lines are used to check increments of voltage $\Delta V$ 10 minutes after the charge starts.

Figure 4B:
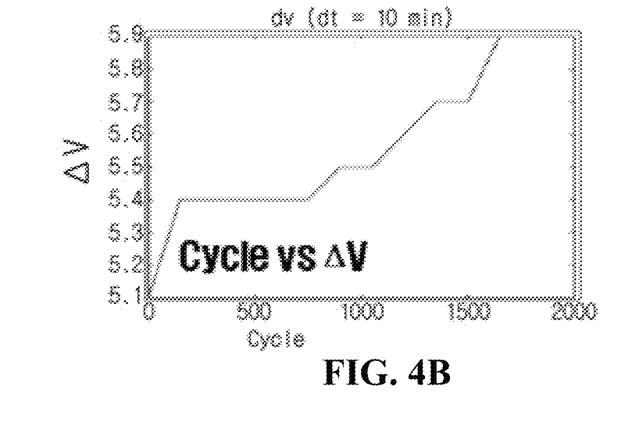
FIG. 4B is a graph representing solid line values of FIG. 4A in relationships between increments of voltage ΔV and cycles of charge and discharge at charging time dt=10 minutes.

It may be found out that FIG. 4B illustrates values of the lines shown in FIG. 4A as the relationships between the increments of voltage $\Delta V$ and cycle of discharge and charge at the charging time dt=10 minutes. As illustrated, as cycles of discharge and charge of the battery increase, the increments of voltage $\Delta V$ increase.

Figure 4C:
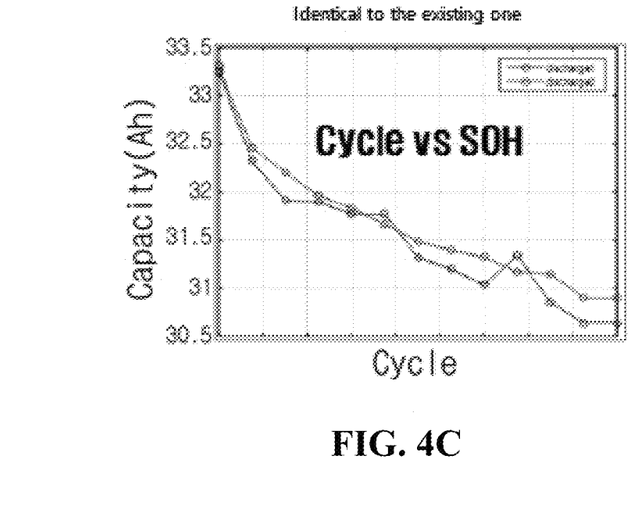
FIG. 4C is a graph illustrating relationships between general remaining capacity of a battery and cycles of charge and discharge.

Meanwhile, FIG. 4C shows the relationships between the normal remaining capacity of the battery and cycles of discharge and charge, where the remaining capacity of the battery can be seen as the residual lifespan (SOH) of the battery SOH). The two graphs in the FIG. 4C show the results under different full discharge and/or charging conditions.

Figure 4D:
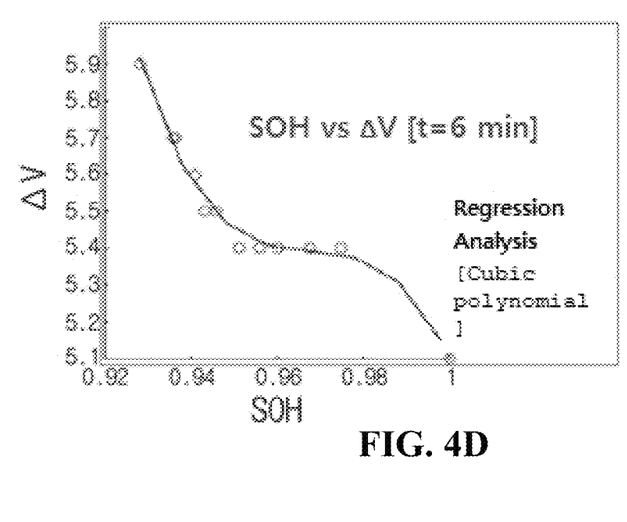
FIG. 4D is a graph representing relationships between deduced increments of voltage ΔV and SOH by combining results of FIGS. 4B and 4C.

FIG. 4D shows a graph representing the relationship between voltage $\Delta V$ and SOH as residual lifespan drawn by combining the results of FIG. 4B and FIG. 4C. Herein, it is possible to select only one of the two graphs in FIG. 4C or use the mean value of the two graphs before combining with the result of FIG. 4B. It can be identified that the increment of voltage $\Delta V$ and the residual lifespan SOH are inversely proportional in a form of cubic polynomial in the regression analysis graph from FIGS. 4A to 4D.

Figure 5A:
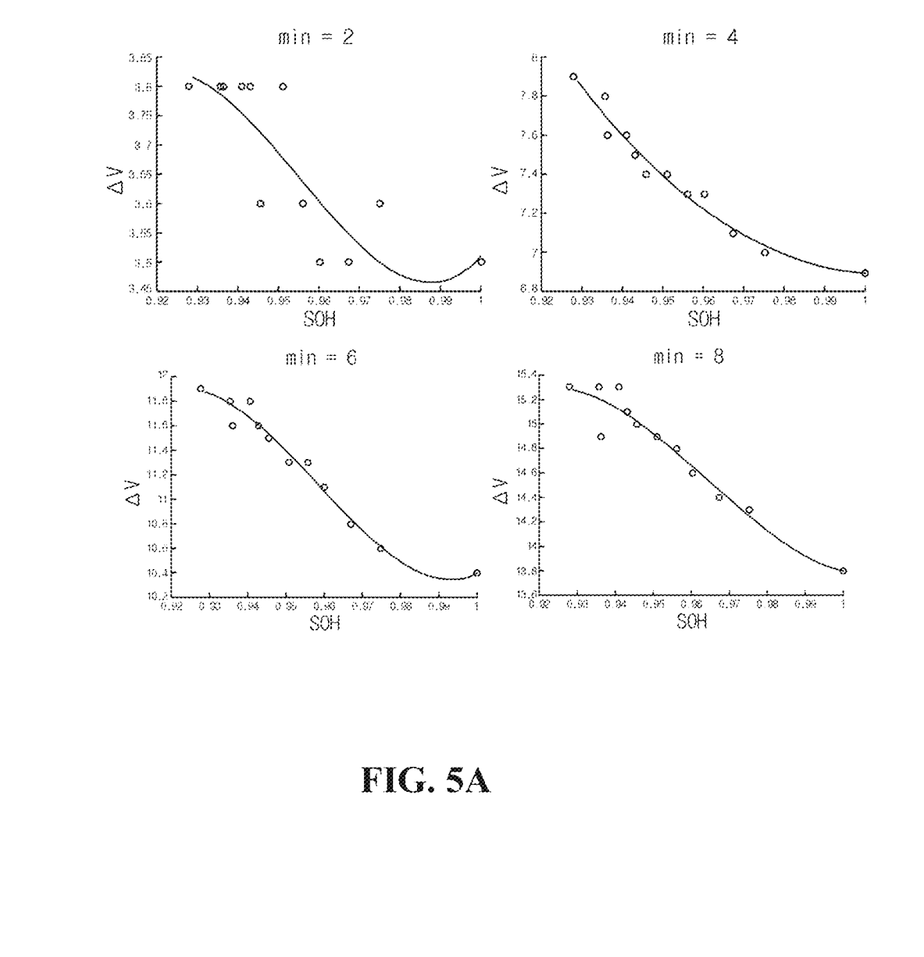
FIGS. 5A to 5C show graphs acquiring a model of ΔV-SOH to explain a principle of application of particle filter and its effect as a statistical technique.
Figure 5B:
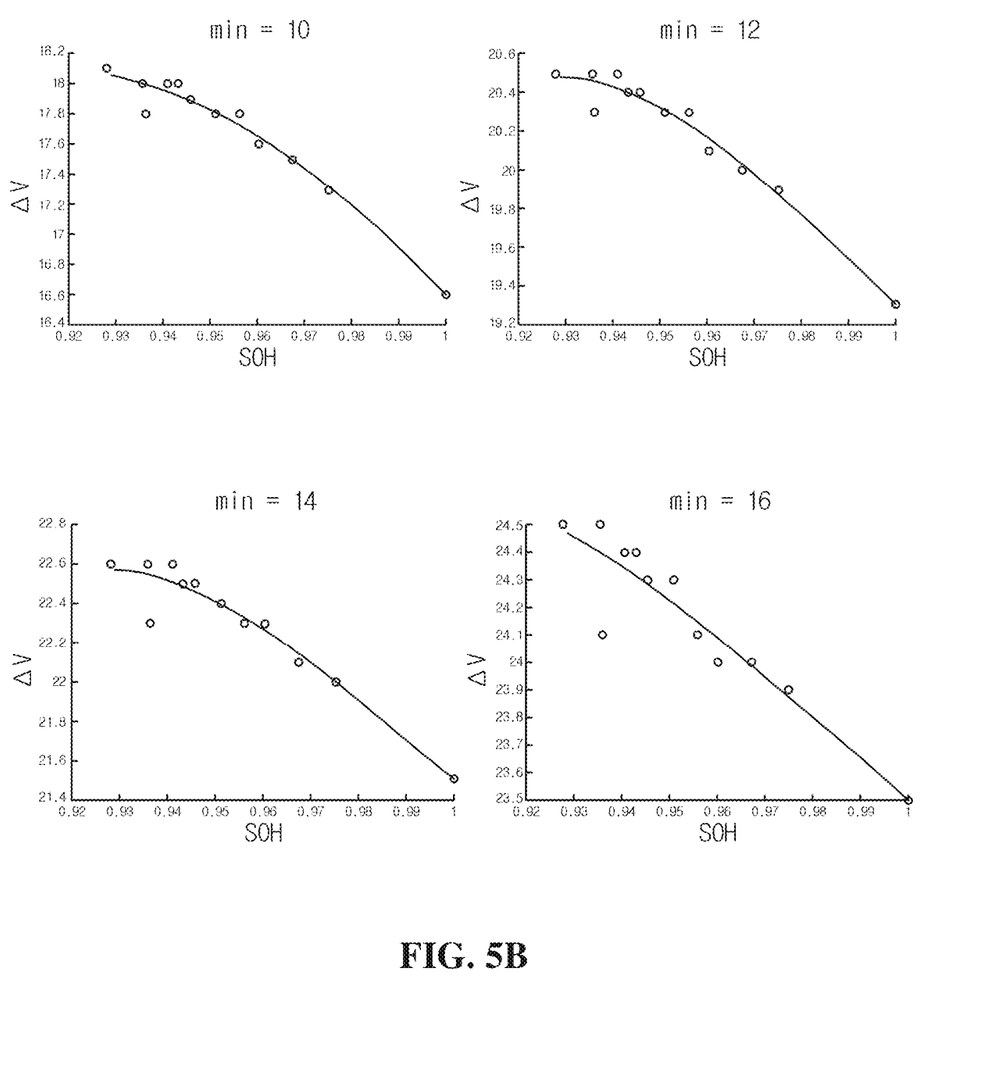
Figure 5C:
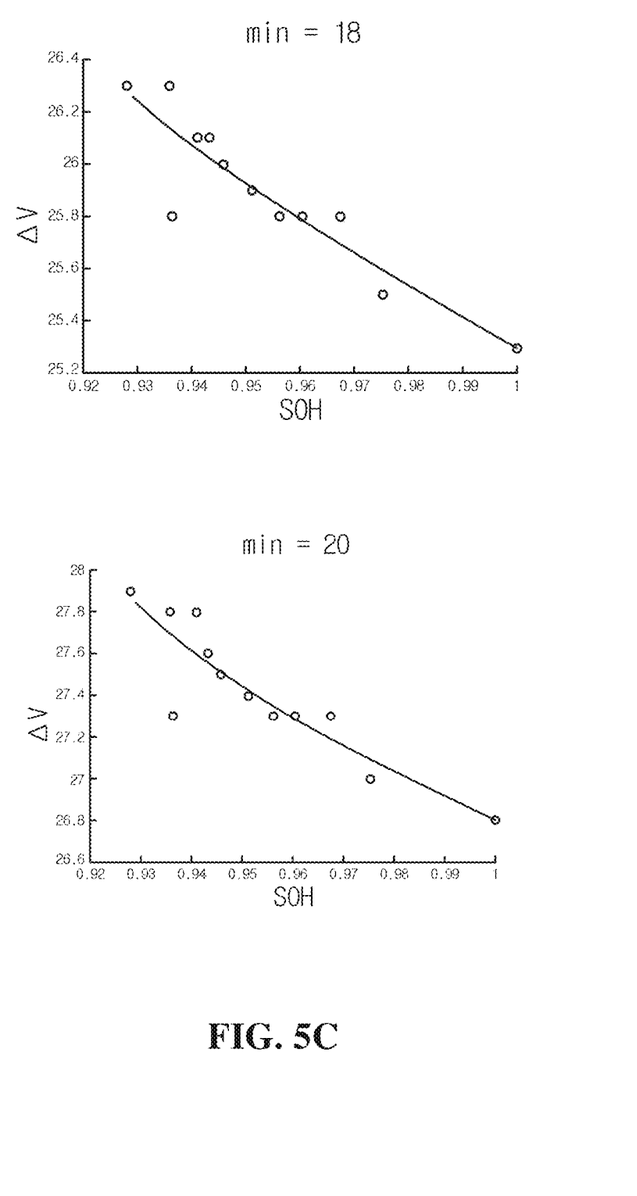

FIGS. 5A through 5C show graphs representing that a model for $\Delta V$ is acquired by applying techniques such as particle filter with respect to 10 measurement values at intervals of 2 minutes from 2 minutes to 20 minutes.

The individual graphs of the drawings may be defined in an equation 1 below.

$$\Delta V_k = a_{0k} + a_{1k} \times SOH_k + a_{2k} \times SOH_h^2 + a_{3k} \times SOH_k^3 \text{ at } k\text{-th time(minutes)} \quad \text{[Equation 1]}$$

By using a least square method, $a0k$ to $a3k$ may be calculated under Equation 2 below.

[Equation 2]

$$a = 1.0e+04 *$$

| −0.2277 | 0.0308 | −0.8121 | −0.4989 | −0.0474 | −0.1687 | −0.1604 | −0.0518 | 0.0590 | 0.1129 |
|---|---|---|---|---|---|---|---|---|---|
| 0.7180 | −0.0736 | 2.5517 | 1.5624 | 0.1391 | 0.5198 | 0.4973 | 0.1682 | −0.1695 | −0.3332 |
| −0.7527 | 0.0571 | −2.6653 | −1.6232 | −0.1278 | −0.5256 | −0.5051 | −0.1724 | 0.1708 | 0.3370 |
| 0.2627 | −0.0135 | 0.9268 | 0.5611 | 0.0378 | 0.1763 | 0.1703 | 0.0584 | −0.0578 | −0.1140 |

The course as illustrated has an advantage of increasing accuracy in calculating the residual lifespan of the battery when applying to statistical techniques the calculated capacities of the battery through two or more cycles of full discharge and charge.

Figure 6A:
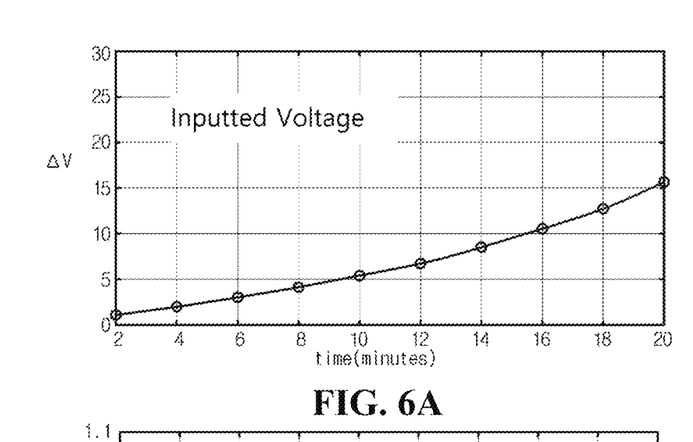
FIGS. 6A to 6D are graphs showing courses of comparing results of estimating scope of SOH by using charging voltage with actual SOH.
Figure 6B:
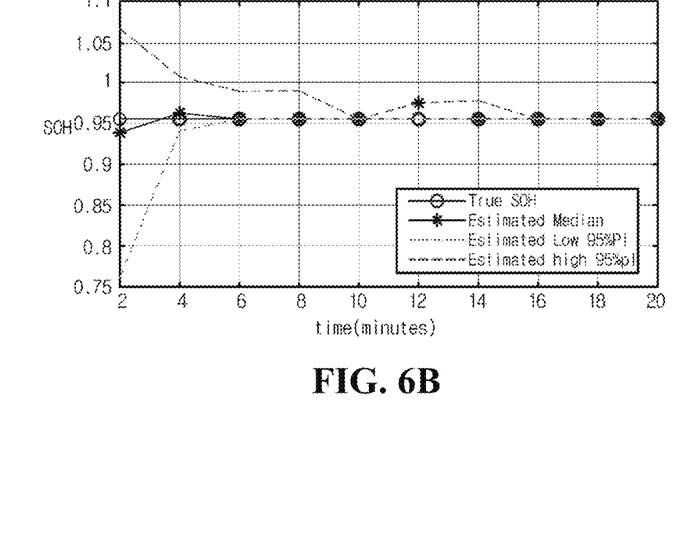
Figure 6C:
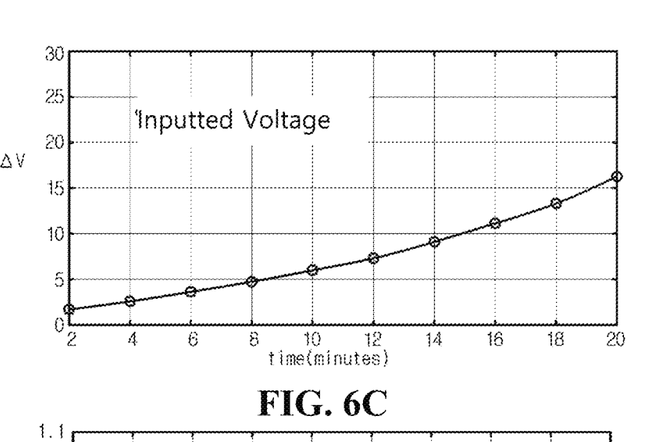
Figure 6D:
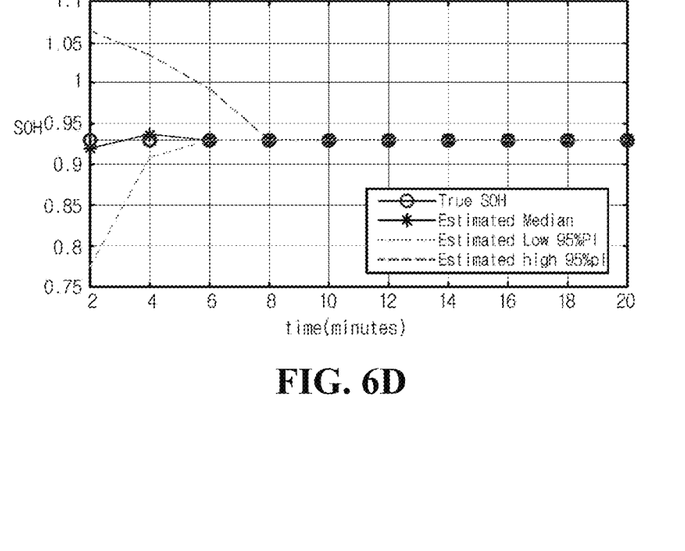

FIGS. 6A and 6C are the graphs with the same relationships as FIG. 4A and FIGS. 6B and 6D are to compare the results of estimating the scope of SOH by using the charging voltage with the actual SOH. It can be found out that the mean values of the estimated results from the Figures are similar to the actual SOH.

TABLE 1

| Cycles of Discharge/Charge | SOH |
|---|---|
| 0 | 1.000 |
| 150 | 0.975 |
| 300 | 0.967 |
| 450 | 0.960 |
| 600 | 0.956 |
| 750 | 0.951 |
| 900 | 0.946 |
| 1050 | 0.943 |
| 1200 | 0.941 |
| 1350 | 0.936 |
| 1500 | 0.935 |
| 1650 | 0.928 |
| 1800 | 0.928 |

Figure 7:
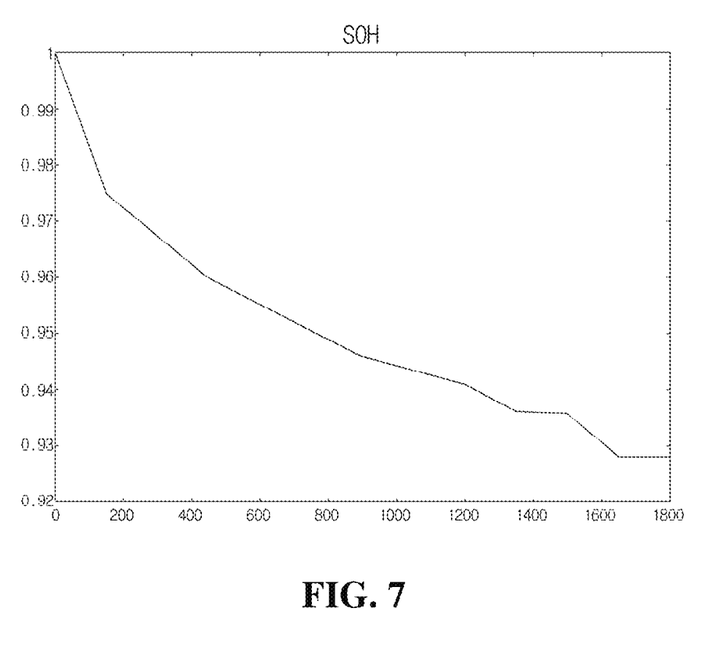
FIG. 7 is a graph showing actually measured values of the capacity (SOH) of the battery from the 0-th cycle to the 1800-th cycle with respect to result values in FIGS. 5A to 6D.

The table 1 above shows the actually measured SOH when the number of cycles of discharge and charge reach to each recovery value on the left column and FIG. 7 is a broken-line graph drawn with relationships in Table 1. Tab. 1 and FIG. 7 show the results of measurement at cycles of discharge and charge from 150 to 1800.

Figure 8:
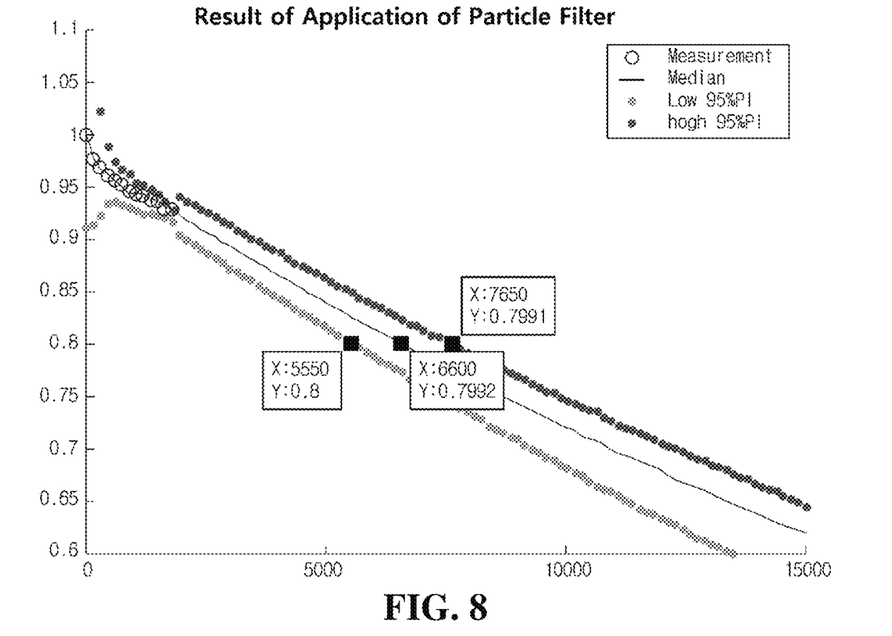
FIG. 8 is a graph illustrating estimates of the capacity (SOH) of the battery until the 15,000-th cycle by applying the particle filter to the result values shown in FIGS. 5A through 6D.

FIG. 8 illustrates a graph of results of actual measurement at cycles of discharge and charge to 15000 from 1800 shown and graphs of estimated values of the results of the model to which the particle filter is applied only based on the measurement results in FIG. 7. In accordance with the implementation, to increase accuracy of the model, the measurement values at the various points of time applied in FIGS. AA to 6D may be used to the particle filter.

In FIG. 7, the actually measured values of the capacity of the battery were simply used through an experiment but when the method for estimating the lifespan of the battery is applied to the actual site in accordance with the idea of the present invention, the calculated values of the capacity of the battery (SOH) obtained by specified operations from increments of voltage would be used. Meanwhile, in an environment (site) where the battery is used with cycles of full charge and full discharge, values of measuring battery capacity (SOH) from data measured from actually used battery may be obtained. Even in this case, it is sure that full charge-partial charge for measurement may be performed in accordance with the idea of the present invention.

An equation regarding the particle filter applied to FIG. 8 with respect to the result of FIG. 7 is as shown in Equation 3 and Table 2 below.

$$x(t+1) = x(t) \times \exp(-b\Delta t) \quad \text{[Equation 3]}$$

TABLE 2

| Median Value | 6600 | 3.065e−5 | 0.101 |
|---|---|---|---|
| 95% Low Limit | 5550 | 3.045e−5 | 0.101 |
| 95% Upper Limit | 7650 | 3.745e−5 | 0.114 |

The median value as expected values by using the statistical technique in FIG. 8 is a middle line while the low limit is a dotted line as the lower line and the upper limit is a dotted line as the upper line over the middle line. When the median value is selected as an estimated value, the mean values of the results estimated from the results of FIG. 8 appeared to drop similarly to the actual SOH and it can be judged from the expectation of the SOH by using the mean values of the estimated results that 80% could be reduced compared to the initial ones when more experiment is conducted at 6600 cycles. In short, it can be determined that 6600 cycles could be the lifespan of the battery under the actual use environment.

It must be noted that the aforementioned example embodiments are just for explanation and not for limitation. In addition, those skilled in the art to which the present invention pertains could understand that various example embodiments may be formed in the scope of the technical idea of the present invention.

REFERENCE NUMERALS

10: Battery
110: Reference data-storing unit
120: Charge/discharge control unit
140: Unit for acquiring pieces of the voltage information
160: Remaining capacity-calculating unit
180: Reference data-creating unit

INDUSTRIAL AVAILABILITY

The present invention, which relates to a method and an apparatus for estimating lifespan of a battery, is available in a field of operating and managing batteries.

What is claimed is:

1. A method for estimating a residual lifespan of a battery, comprising the steps of:
   fully discharging the battery;
   partially charging the fully discharged battery under a predetermined charging condition;
   acquiring pieces of voltage information at multiple specific points of measurement time while partially charging the battery; and
   calculating a remaining capacity of the battery by using the acquired pieces of voltage information,
   wherein, at the step of acquiring pieces of voltage information, increments of voltage from a time of starting to charge the fully discharged battery to the specific points of measurement time are acquired,
   wherein, at the step of calculating the remaining capacity of the battery, a particle filter is applied to the acquired pieces of voltage information,
   wherein the step of calculating the remaining capacity of the battery includes the steps of: calculating a battery capacity measured at one cycle of full discharge and charge once by using the measured increments of voltage; and
   calculating the residual lifespan of the battery by applying capacities measured at multiple cycles of full discharge and charge to a statistical method.

2. The method of claim 1, wherein the step of fully discharging is performed when a load starts to be stabilized based on an operation schedule or an accumulated operation pattern of an ESS composed of the battery.

3. The method of claim 2, wherein the step of fully charging is performed if a state of charge (SOC) of the battery is lower than a preset threshold when the load starts to be stabilized.

4. An apparatus for estimating a residual lifespan of a battery, comprising:
   a reference data-storing unit for storing reference data that become a basis of estimating the residual lifespan of the battery;
   a charge/discharge-controlling unit for fully discharging the battery to estimate the residual lifespan of and partially charging the battery under a predetermined charging condition;

a voltage information-acquiring unit for acquiring pieces of voltage information of the battery at multiple specific points of measurement time while partially discharging the battery; and a remaining capacity-calculating unit for calculating a remaining capacity of the battery by using the acquired voltage information and the reference data, wherein the remaining capacity-calculating unit repeats the step of calculating battery capacities measured at one cycle of full discharge and charge and also at multiple cycles of full discharge and charge, and calculates the residual lifespan of the battery by the calculated battery capacities which are applied to particle filter.

5. The apparatus of claim 4, wherein, during actual use of the battery, full discharge is performed when a load starts to be stabilized based on an operation schedule or an accumulated operation pattern of an ESS composed of the battery.

6. The apparatus of claim 4, further comprising a unit for creating reference data to acquire the pieces of voltage information of the battery at the multiple specific points of measurement time if charge/discharge operations are conducted in a scope that meets the predetermined charging condition after the full discharge, and creating the reference data stored in the reference data-storing unit.

* * * * *